United States Patent
Lee et al.

(10) Patent No.: US 8,105,465 B2
(45) Date of Patent: Jan. 31, 2012

(54) METHOD FOR DEPOSITING CONFORMAL AMORPHOUS CARBON FILM BY PLASMA-ENHANCED CHEMICAL VAPOR DEPOSITION (PECVD)

(75) Inventors: Kwangduk Douglas Lee, Redwood City, CA (US); Takashi Morii, Wakayama (JP); Yoichi Suzuki, Chiba-Ken (JP); Sudha Rathi, San Jose, CA (US); Martin Jay Seamons, San Jose, CA (US); Deenesh Padhi, Sunnyvale, CA (US); Bok Hoen Kim, San Jose, CA (US); Cynthia Pagdanganan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 12/577,455

(22) Filed: Oct. 12, 2009

(65) Prior Publication Data
US 2010/0093187 A1    Apr. 15, 2010

Related U.S. Application Data

(60) Provisional application No. 61/105,348, filed on Oct. 14, 2008.

(51) Int. Cl.
*C01B 31/00* (2006.01)
(52) U.S. Cl. ....................................................... 204/173
(58) Field of Classification Search .................... 204/173
See application file for complete search history.

(56) References Cited

U.S. PATENT DOCUMENTS

| | | | |
|---|---|---|---|
| 6,364,954 B2 * | 4/2002 | Umotoy et al. | 118/715 |
| 6,573,030 B1 * | 6/2003 | Fairbairn et al. | 430/323 |
| 2005/0287771 A1 * | 12/2005 | Seamons et al. | 438/482 |
| 2006/0269692 A1 | 11/2006 | Balseanu et al. | |
| 2008/0003824 A1 | 1/2008 | Padhi et al. | |
| 2008/0008842 A1 * | 1/2008 | Soo et al. | 427/569 |
| 2010/0291713 A1 * | 11/2010 | Lee et al. | 438/5 |

FOREIGN PATENT DOCUMENTS
KR      0777043      11/2007

OTHER PUBLICATIONS
International Search Report and Written Opinion of the International Searching Authority mailed Apr. 29, 2010 in PCT/US2009/060360.

* cited by examiner

*Primary Examiner* — N Drew Richards
*Assistant Examiner* — Grant Withers
(74) *Attorney, Agent, or Firm* — Patterson & Sheridan, L.L.P.

(57) ABSTRACT

Methods and apparatus for depositing an amorphous carbon layer on a substrate are provided. In one embodiment, a deposition process includes positioning a substrate in a substrate processing chamber, introducing a hydrocarbon source having a carbon to hydrogen atom ratio of greater than 1:2 into the processing chamber, introducing a plasma initiating gas selected from the group consisting of hydrogen, helium, argon, nitrogen, and combinations thereof into the processing chamber, with the hydrocarbon source having a volumetric flow rate to plasma initiating gas volumetric flow rate ratio of 1:2 or greater, generating a plasma in the processing chamber, and forming a conformal amorphous carbon layer on the substrate.

17 Claims, 6 Drawing Sheets

FIG. 1

(PRIOR ART)

METHOD FOR DEPOSITING CONFORMAL AMORPHOUS CARBON FILM BY PLASMA-ENHANCED CHEMICAL VAPOR DEPOSITION (PECVD)

CROSS-REFERENCE TO RELATED APPLICATIONS

This application claims benefit of U.S. provisional patent application Ser. No. 61/105,348, filed Oct. 14, 2008, which is herein incorporated by reference.

BACKGROUND OF THE INVENTION

1. Field of the Invention

Embodiments of the present invention generally relate to the fabrication of integrated circuits and particularly to the deposition of an amorphous carbon layer on a semiconductor substrate.

2. Description of the Related Art

Integrated circuits have evolved into complex devices that can include millions of transistors, capacitors and resistors on a single chip. The evolution of chip design continually requires faster circuitry and greater circuit density. The demand for faster circuits with greater circuit densities imposes corresponding demands on the materials used to fabricate such integrated circuits. In particular, as the dimensions of integrated circuit components are reduced to submicron dimensions, it has been necessary to use not only low resistivity conductive materials such as copper to improve the electrical performance of devices, but also low dielectric constant insulating materials, often referred to as low-k dielectric materials. Low-k dielectric materials generally have a dielectric constant of less than 3.8.

Producing devices having low-k dielectric materials with little or no surface defects or feature deformation is problematic. Low-k dielectric materials having a dielectric constant less than about 3.0 are often porous and susceptible to being scratched or damaged during subsequent process steps, thus increasing the likelihood of defects being formed on the substrate surface. Such low-k dielectric materials are often brittle and may deform under conventional polishing processes, such as chemical mechanical polishing (CMP). One solution to limiting or reducing surface defects and deformation of such low-k dielectric materials is the deposition of a hardmask over the exposed low-k dielectric materials prior to patterning and etching. The hardmask prevents damage and deformation of the delicate low-k dielectric materials. In addition, a hardmask layer may act as an etch mask in conjunction with conventional lithographic techniques to prevent the removal of the low-k dielectric material during etch.

Additionally, hardmasks are being used for almost every step in integrated circuit manufacturing processes for both front-end and back-end processes. As device sizes shrink and pattern structure becomes more complex and difficult to manufacture, an etch hardmask is becoming more important as available photoresists are failing to meet the etching resistance requirements and photoresists are simply being used for image transfer rather than as an etch mask in a lithography and etching process. Instead hardmasks that receive the image pattern are becoming the primary material for effective etching of patterns in underlying layers.

Amorphous hydrogenated carbon is a material that may be used as a hardmask for metals, amorphous silicon, and dielectric materials, such as silicon dioxide or silicon nitride materials, among others. Amorphous hydrogenated carbon, also referred to as amorphous carbon and may be denoted as a-C:H or α-C:H, is considered a carbon material with no long-range crystalline order and which may contain substantial hydrogen content, for example on the order of about 10 to 45 atomic % of hydrogen. Amorphous carbon has been observed to have chemical inertness, optical transparency, and good mechanical properties. While a-C:H films can be deposited via various techniques, plasma enhanced chemical vapor deposition (PECVD) is widely used due to cost efficiency and film property tunability. In a typical PECVD process, a hydrocarbon source, such as a gas-phase hydrocarbon or a liquid-phase hydrocarbon that has been entrained in a carrier gas, is introduced into a PECVD chamber. Plasma is then initiated in the chamber to create excited CH— radicals. The excited CH— radicals are chemically bound to the surface of a substrate positioned in the chamber, forming the desired a-C:H film thereon.

For applications in which a hardmask layer is deposited on a substrate having topographic features, the hardmask layer is required to conformally cover all surfaces of said topographic features. Additionally as feature sizes are reduced, photoresists materials have trouble correctly transferring patterns due to the limitation of light wavelengths and pattern sizes. As such, new processes and material are becoming required to address these challenges, of which hardmasks are becoming critical to the effective transfer of critical dimension for the next generation devices.

Figure 1:
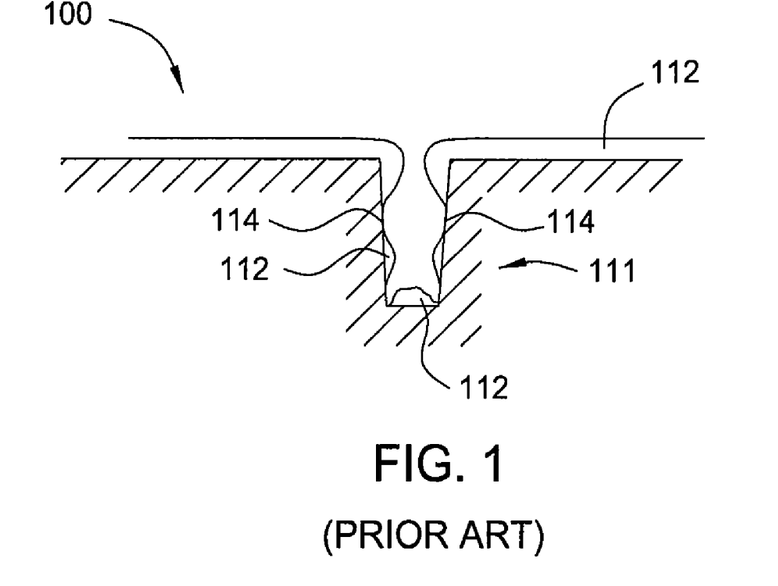
FIG. 1 (Prior Art) is a schematic cross-sectional view of a substrate with a feature and a non-conformal amorphous carbon layer formed thereon.

Hardmask layer deposition conformality is difficult to achieve on a substrate with an underlying topography, for example an alignment key used to align the patterning process. FIG. 1 illustrates a schematic cross-sectional view of a substrate 100 with a feature 111 and a non-conformal amorphous carbon layer 112 formed thereon. Because non-conformal amorphous carbon layer 112 does not completely cover the sidewalls 114 of feature 111, subsequent etching processes may result in unwanted erosion of sidewalls 114. The lack of complete coverage of sidewalls 114 by non-conformal amorphous carbon layer 112 may also lead to photoresist poisoning of the material under non-conformal carbon layer 112, which is known to damage electronic devices.

Therefore, there is a need for a method of depositing a material layer useful for integrated circuit fabrication which can be conformally deposited on substrates having topographic features.

SUMMARY OF THE INVENTION

Embodiments of the present invention provide a method for processing a substrate, such as by depositing an amorphous carbon layer on the substrate. The method, according to a first embodiment, includes positioning a substrate in a substrate processing chamber, introducing a hydrocarbon source having a carbon to hydrogen atom ratio of greater than 1:2 into the processing chamber, introducing a plasma initiating gas selected from the group consisting of hydrogen, helium, argon, nitrogen, and combinations thereof into the processing chamber, with the hydrocarbon source having a volumetric flow rate to plasma initiating gas volumetric flow rate ratio of 1:2 or greater, generating a plasma in the processing chamber at a RF power of 1 W/cm$^2$ or less, a pressure of 2 Torr or greater, and a temperature of about 300° C. to about 480° C., and forming a conformal amorphous carbon layer on the substrate.

In another embodiment, a method is provided for processing a substrate including performing a deposition cycle comprising forming a conformal amorphous carbon material on a surface of the substrate, and flowing a purge process through the processing chamber, and repeating the cycle between 2 and 50 times.

In another embodiment, a method is provided for processing a substrate including positioning a substrate in a substrate processing chamber, introducing a hydrocarbon source having a carbon to hydrogen atom ratio greater than 1:2 into the processing chamber, introducing a plasma initiating gas selected from the group consisting of hydrogen, helium, argon, nitrogen, and combinations thereof into the processing chamber, with the hydrocarbon source having a volumetric flow rate to plasma initiating gas volumetric flow rate ratio of 1:2 or greater, wherein the hydrocarbon source and the plasma initiating gas are introduced into the processing chamber by a gas distributor position between 400 mils and 600 mils from the substrate surface, generating a plasma in the processing chamber at a RF power of 1 W/cm$^2$ or less and a temperature between about 0° C. to about 100° C., and forming a conformal amorphous carbon layer on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments described herein generally provide methods for depositing amorphous carbon materials (a-C:H) with improved conformality in a chemical vapor deposition system. Conformality of a layer is typically quantified by a ratio (which may be represented as a percentage) of the average thickness of a layer deposited on the sidewalls of a feature to the average thickness of the same deposited layer on the field, or upper surface, of the substrate. Layers deposited by the methods described herein are observed to have a conformality of greater than about 30%, such as 70% or greater, about 7:10 or grater, such as about 80% or greater, about 4:5 greater, to about 100%, about 1:1. For example, the prior art non-conformal amorphous carbon layer 112 as shown in FIG. 1 would be considered to have 0% conformity due to the lack of a layer deposition on the sidewalls 114.

In particular, methods are provided for improved conformal deposition of an a-C:H layer. Conformal deposition may be improved by utilizing precursors having carbon to hydrogen ratios of 1:2 or greater, such as a carbon to hydrogen ratio of 2:3 or greater, with plasma-initiating gas selected from the group of helium, hydrogen, nitrogen, argon, or combinations thereof, at increasing precursor to plasma-initiating gas flow rates, at increasing deposition pressures, at increasing deposition temperatures, at lower RF power application, with plasma environments having reduced deposition rates, by depositing amorphous carbon in multiple layers, and combinations thereof. The deposition processes herein may be performed in a suitable processing system.

Figure 3:
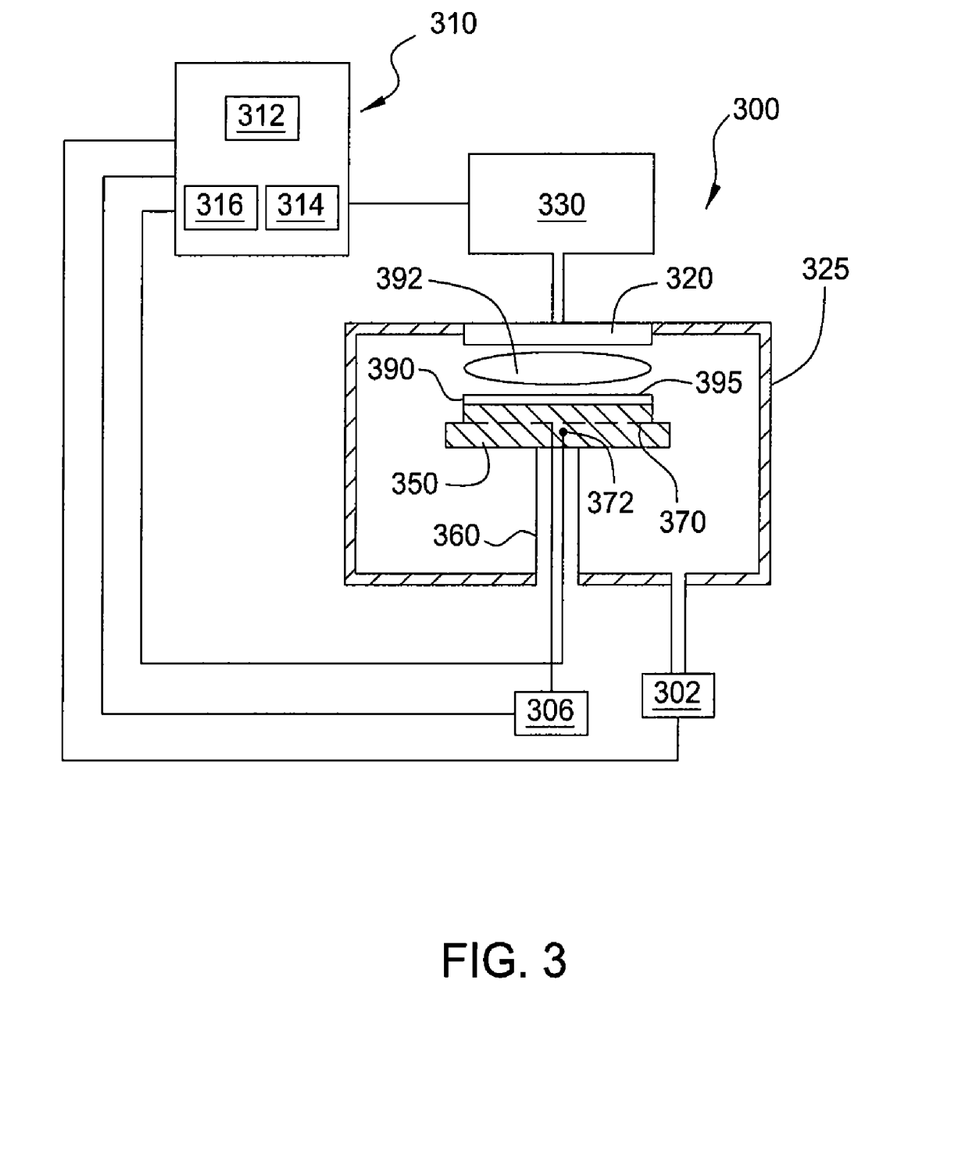
FIG. 3 is a schematic representation of a substrate processing system that can be used to perform amorphous carbon layer deposition according to embodiments of the invention.

FIG. 3 is a schematic representation of a substrate processing system, system 300, which can be used for amorphous carbon layer deposition according to embodiments of the present invention. Examples of suitable systems include the CENTURA® systems which may use a DxZ™ processing chamber, PRECISION 5000® systems, PRODUCER™ systems, such as the PRODUCER SE™ processing chamber and the PRODUCER GT™ processing chamber, all of which are commercially available from Applied Materials, Inc., Santa Clara, Calif.

System 300 includes a process chamber 325, a gas panel 330, a control unit 310, and other hardware components such as power supplies and vacuum pumps. Details of one embodiment of the system used in the present invention are described in a commonly assigned U.S. patent "High Temperature Chemical Vapor Deposition Chamber", U.S. Pat. No. 6,364,954, issued on Apr. 2, 2002, which is hereby incorporated by reference herein.

The process chamber 325 generally comprises a substrate support pedestal 350, which is used to support a substrate such as a semiconductor substrate 390. This substrate support pedestal 350 moves in a vertical direction inside the process chamber 325 using a displacement mechanism (not shown) coupled to shaft 360. Depending on the process, the semiconductor substrate 390 can be heated to a desired temperature prior to processing. The substrate support pedestal 350 is heated by an embedded heater element 370. For example, the substrate support pedestal 350 may be resistively heated by applying an electric current from a power supply 306 to the heater element 370. The semiconductor substrate 390 is, in turn, heated by the substrate support pedestal 350. A temperature sensor 372, such as a thermocouple, is also embedded in the substrate support pedestal 350 to monitor the temperature of the substrate support pedestal 350. The measured temperature is used in a feedback loop to control the power supply 306 for the heater element 370. The substrate temperature can be maintained or controlled at a temperature that is selected for the particular process application.

A vacuum pump 302 is used to evacuate the process chamber 325 and to maintain the proper gas flows and pressure inside the process chamber 325. A showerhead 320, through which process gases are introduced into process chamber 325, is located above the substrate support pedestal 350 and is adapted to provide a uniform distribution of process gases into process chamber 325. The showerhead 320 is connected to a gas panel 330, which controls and supplies the various process gases used in different steps of the process sequence. Process gases may include a hydrocarbon source and a plasma-initiating gas and are described in more detail below in conjunction with a description of an exemplary argon-diluted deposition process.

The gas panel 330 may also be used to control and supply various vaporized liquid precursors. While not shown, liquid precursors from a liquid precursor supply may be vaporized, for example, by a liquid injection vaporizer, and delivered to process chamber 325 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 320 and substrate support pedestal 350 may also form a pair of spaced electrodes. When an electric field is generated between these electrodes, the process gases introduced into chamber 325 are ignited into a plasma 392. Typically, the electric field is generated by connecting the substrate support pedestal 350 to a source of single-frequency or dual-frequency radio frequency (RF) power (not shown) through a matching network (not shown). Alternatively, the RF power source and matching network may be coupled to the showerhead 320, or coupled to both the showerhead 320 and the substrate support pedestal 350.

PECVD techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas and liquid flows through the gas panel 330 is performed by mass flow controllers (not shown) and a control unit 310 such as a computer. The showerhead 320 allows process gases from the gas panel 330 to be uniformly distributed and introduced into the process chamber 325. Illustratively, the control unit 310 comprises a central processing unit (CPU) 312, support circuitry 314, and memories containing associated control software 316. This control unit 310 is responsible for automated control of the numerous steps required for substrate processing, such as substrate transport, gas flow control, liquid flow control, temperature control, chamber evacuation, and so on. When the process gas mixture exits the showerhead 320, plasma enhanced thermal decomposition of the hydrocarbon compound occurs at the surface 395 of the semiconductor substrate 390, resulting in the deposition of an amorphous carbon layer on the semiconductor substrate 390.

Deposition Process

Aspects of the invention provide for improved conformal deposition of an a-C:H layer. Improved conformal deposition may be achieved by a process utilizing precursors having carbon to hydrogen ratios of 1:2 or greater, such as a carbon to hydrogen ratio of 2:3 or greater, may be achieved with a plasma-initiating gas selected from the group of helium, hydrogen, nitrogen, argon, or combinations thereof, may be achieved at increasing precursor to plasma-initiating gas flow rates, may be achieved at increasing deposition pressures, may be achieved at increasing deposition temperatures, may be achieved at lower RF power application, may be achieved with plasma environments having reduced deposition rates, may be achieved with increasing spacing between gas distributer and substrate surface, may be achieved by depositing amorphous carbon in multiple layers, and combinations thereof. It is believed that the processes described herein provide for a reduced deposition rate and/or a more isotropic deposition process, thereby, providing a more conformal deposition process.

In one aspect of the deposition process, an a-C:H layer is formed by a process that includes introducing a hydrocarbon source and a plasma-initiating gas into a processing chamber, such as process chamber 325 described above in conjunction with FIG. 3. The hydrocarbon source is a mixture of one or more hydrocarbon compounds, and, optionally, a carrier gas, such as argon.

The one or more hydrocarbon compounds may comprise compounds having a carbon atom to hydrogen atom ratio of 1:2 or greater, for example greater than 1:2. For example, a carbon to hydrogen (or substituent group, such as fluorine, for hydrogen) ratio of 2:3 or greater, such as from 2:3 to 2:1, for example, from about 2:3 to about 3:2, is observed to produce amorphous carbon films with improved conformity. It is believed such hydrocarbon compounds with the described carbon to hydrogen atom ratio lead to a more isotropic deposition process.

The hydrocarbon compounds may be partially or completely doped derivatives of hydrocarbon compounds may also benefit from the inventive method. Derivatives include nitrogen-, fluorine-, oxygen-, hydroxyl group-, and boron-containing derivatives of hydrocarbon compounds.

Generally, hydrocarbon compounds or derivatives thereof that may be included in the hydrocarbon source may be described by the formula $C_A H_B F_C$, where A has a range of between 1 and 24, B has a range of between 0 and 50, C has a range of 0 to 50 and the ratio of A to B+C is 1:2 or greater, for example greater than 1:2. For example, the ratio of A to B+C may be 2:3 or greater, such as from 2:3 to 2:1, and in a further example, from 2:3 to 3:2. In one embodiment, where C=0, the hydrocarbon source may have the formula CxHy with $2/3 =< x/y =< 3/2$, with x/y being the respective number of atoms. Alternatively, for oxygen and/or nitrogen substituted compounds, the hydrocarbon source may be described by the formula $C_A N_B O_C F_D N_E$, where A has a range of between 1 and 24, B has a range of between 0 and 50, C has a range of 0 to 10, D has a range of 0 and 50, E has a range of 0 to 10, and the ratio of A to B+C+D+E is 1:2 or greater, for example greater than 1:2. For example, A to B+C+D+E may be 2:3 or greater, such as from 2:3 to 2:1, and in a further example, from 2:3 to 3:2.

Suitable hydrocarbon compounds include one or more of the following compounds, for example, alkynes such as acetylene ($C_2H_2$), vinylacetylene and derivatives thereof, aromatic hydrocarbons, such as benzene, styrene, toluene, xylene, pyridine, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like. Additional suitable hydrocarbons include alkenes such as ethylene, propylene, butylene, pentene, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. One example of a precursor having a carbon atom to hydrogen atom ratio of greater than 1:2 is $C_4H_2$, which may be diacetylene.

Additionally, the invention contemplates the use of precursors having a carbon atom to hydrogen atom ratio of 3:1 or greater, such as 5:1, for example, of 10:1 or greater.

It is believed that as the carbon to hydrogen ratio increases, carbon atoms will bond with neighboring carbon atoms during depositon, resulting in better conformality of deposited film by forming a web of complex three-dimensional short-order structures.

The a-C:H deposition process includes the use of a plasma-initiating gas that is introduced into the chamber at before and/or same time as the hydrocarbon compound and a plasma is initiated to begin deposition. The plasma-initiating gas may be a high ionization potential gas including to, and not limited to, helium gas, hydrogen gas, nitrogen gas, argon gas and combinations thereof, of which helium gas is preferred. The plasma-initiating gas may also be a chemically inert gas, such as helium gas, nitrogen gas, or argon gas is preferred. Suitable ionization potentials for gases are from about 5 eV (electron potential) to 25 eV. The plasma-initiating gas may be introduced into the chamber before the hydrocarbon source, which allows a stable plasma to be formed and reduces the chances of arcing. The use of the plasma-initiating gas with high ionization potential has been observed to provide for less anisotropic etching of film during deposition thereby improving conformality in amorphous carbon film deposition. An inert gas as a dilutant gas or a carrier gas, such as argon, may be introduced with the plasma-initiating gas, the hydrocarbon source, or combinations thereof.

The hydrocarbon compound and plasma-initiating gas may be introduced at a hydrocarbon compound to plasma-initiating gas flow ratio from about 1:100 or greater, for example, from about 1:100 to 100:1, such as from about 1:10 to about 10:1 for the amorphous carbon deposition. In one embodiment, the hydrocarbon compound to plasma-initiating gas flow ratio may be from about 1:5 or greater, such as from about 1:5 to about 2:1, for example, from about 1:2 to about 1:1, may be used for the amorphous carbon deposition. Increasing hydrocarbon compound to plasma-initiating gas flow ratio has been observed to provide improved conformality over lower ratios.

The a-C:H layer may be deposited from the processing gas by maintaining a chamber pressure of about 2 Torr or greater, such as from about 2 Torr to about 20 Torr, and in one embodiment, about 7 Torr or greater, for example, from about 7 Torr to about 9 Torr. It has been observed that conformality increases with increasing pressures and it is believed that ions experience more scattering before reaching the substrate, thereby losing some ability to etch and radicals which experience more scattering and arrive at the substrate surface an angle that is more random and isotropic for a more isotropic and conformal film growth.

The a-C:H layer may be deposited from the hydrocarbon source in a chamber maintaining a substrate temperature from about 0° C. to about 800° C., such as at a temperature from about 0° C. to about 100° C. or at a temperature from about 300° C. to about 480° C., for example, from about 400° C. to about 450° C. It has been observed that depositing amorphous carbon film at increasing temperatures reduces the deposition rate and hence improves conformality. Also, at increasing temperature, the diffusivity or mobility of adsorbed carbon precursor is increasing, leading to more isotropic deposition and improved conformality.

Additionally, the a-C:H layer can also be deposited in a more conformal manner when the layer is deposited from the hydrocarbon source in a chamber maintaining a substrate temperature less than about 100° C. For example, an a-C:H layer was deposited by providing 3800 sccm of $C_2H_2$ and 6000 sccm of Helium to a process chamber maintained at a pressure of 9 Torr and 75° C. through a showerhead spaced from the substrate surface by 310 mils, and generating a plasma by application of high frequency power of 30 watts. The analyzed deposited layer exhibited a conformality (measure of conformality is defined as the ratio of the average thickness S of amorphous carbon layer deposited on the sidewalls of a feature to the average thickness T of amorphous carbon layer on upper surface of substrate) of 77.8%. Similarly, it was also observed that to ratio of the thickness of the amorphous carbon layer on the bottom of the feature compared to the thickness T of the amorphous carbon layer on upper surface of substrate was 72.2%.

It was also surprising and unexpectedly discovered that depositing the less than 100C temperature at a reduced helium flow rate, for example, about 3000 sccm Helium, produce a substantial improvement in the deposition thickness on the bottom of a feature definition as compared to the ratio of the thickness of the amorphous carbon layer on the bottom of the feature compared to the thickness T of the amorphous carbon layer on upper surface of substrate was 72.2% over dense feature definitions, i.e., about 9 features per 1600 $nm^2$.

It has also been observed that conformality of the deposited amorphous carbon layer improved with increasing spacing between the showerhead and substrate surface when depositing the layer, such as between 400 mils and 600 mils spacing, for example, about 500 mils spacing. For example, a second amorphous carbon layer was deposited under the same conditions as the preceding paragraph with regard to low temperature deposition, with the exception of the showerhead spacing being 500 mils compared to 310 mils. The analyzed deposited second layer exhibited a conformality (measure of conformality is defined as the ratio of the average thickness S of amorphous carbon layer deposited on the sidewalls of a feature to the average thickness T of amorphous carbon layer on upper surface of substrate) of 90.9% to 91.7%. Similarly, it was also observed that to ratio of the thickness of the amorphous carbon layer on the bottom of the feature compared to the thickness T of the amorphous carbon layer on upper surface of substrate was 90.9% to 91.7% over feature patterns having different densities, such as dense feature definitions, i.e., about 4 to 20 features, for example, 9 feature definitions per 1600 $nm^2$ as compared to less dense feature definitions, less than 4 features definitions, such as 1 feature definition, per 1600 $nm^2$.

The 500 mil spacing amorphous carbon layer also was observed to have a deposition rate of about 138 Å/min compared to the 310 mil spacing deposition process deposition rate of 300 Å/min.

The hydrocarbon source and a plasma-initiating gas are introduced into the chamber and a plasma is initiated to begin deposition. A dual-frequency RF system may be used to generate the plasma. A dual frequency RF power application is believed to provide independent control of flux and ion energy, since it is believed that the energy of the ions hitting the film surface influences the film density. It is believed that the high frequency plasma controls plasma density and a low frequency plasma controls kinetic energy of the ions hitting the substrate surface. A dual-frequency source of mixed RF power provides a high frequency power in a range from about 10 MHz to about 30 MHz, for example, about 13.56 MHz, as well as a low frequency power in a range of from about 10 KHz to about 1 MHz, for example, about 350 KHz. When a dual frequency RF system is used to deposit an a-C:H film, the ratio of the second RF power to the total mixed frequency power is preferably less than about 0.6 to 1.0 (0.6:1). The applied RF power and use of one or more frequencies may be varied based upon the substrate size and the equipment used. A single frequency RF power application may be used, and is typically, an application of the high frequency power as described herein.

Plasma may be generated by applying RF power at a power density to substrate surface area of from about 0.01 W/cm$^2$ to about 5 W/cm$^2$, such as from about 0.01 to about 1 W/cm$^2$, for example, about 0.1 W/cm$^2$. The power application may be from about 1 Watt to about 2000 watts, such as from about 10 W to about 200 W, for example about 20 W for a 300 mm substrate. Electrode spacing, i.e., the distance between the substrate and the showerhead, may be from about 200 mils to about 1000 mils.

While not holding to any particular theory, it is believed that plasma process reduces amorphous carbon deposition rates to improve the conformality by reducing the number of energetic ions, making hydrocarbon compounds, i.e., radicals, arriving at the substrate surface with a more random deposition pattern, thereby providing the resulting film growth with a more isotropic deposition pattern. The reduced plasma deposition is also observed to provide a lower deposition rate that allows for adsorbed carbon precursors to diffuse on the surface of the substrate and provide a more conformal layer.

An exemplary deposition process for processing 300 mm circular substrates employs a plasma-initiating gas, such as helium, and a hydrocarbon source, such as acetylene ($C_2H_2$). The process may include supplying a plasma-initiating gas, such as helium, at a flow rate from about 400 sccm to about 8000 sccm, supplying a hydrocarbon source, such as acetylene ($C_2H_2$), at a flow rate from about 400 sccm and 8000 sccm, applying a dual frequency RF power from about 10 W to about 2000 W, maintaining a chamber pressure from about 2 Torr about 20 Torr, and maintaining a chamber temperature from about 25° C. to about 475° C. This process range provides a deposition rate for an a-C:H layer in the range of about 10 Å/min to about 30000 Å/min with a conformity (a ratio of the average thickness of a layer deposited on the sidewalls of a feature to the average thickness of the same deposited layer on the field, or upper surface, of the substrate) from about 30% to about 100%. One skilled in the art, upon reading the disclosure herein, can calculate appropriate process parameters in order to produce an a-C:H film of different deposition rate.

In one embodiment of the deposition process, a plurality of individual amorphous carbon depositions are performed to form an amorphous carbon layer. In one aspect of the multiple deposition process, a deposition step, such as described herein, is followed by a pause step, in which plasma-initiating gas, a dilution gas, and/or precursor can be flown with a reduced or no deposition rate. A suitable plasma-initiating gas, a dilution gas, and/or precursor can be flown into the chamber at a flow rate from about 100 sccm to about 40000 sccm. A plasma may be initiated for the pause step if the plasma-initiating gas and/or a dilution gas is used. The deposition and pause steps may then be repeated until a desired thickness is obtained and may be from 1 to 100 cycles, such as from 10 to 50 cycles, for example 30 cycles, or alternatively deposited between about 1% to about 100% of the thickness of the amorphous carbon material, such as from 2% to about 10% cycles, for example about 3.3%. An individual cycle may deposit amorphous carbon material from about 1 Å to about 1000 Å thickness for each cycle to form an amorphous carbon layer having a thickness from about 10 Å to about 15000 Å. The cyclical deposition process may use one or more of the above described process parameter adjustments.

Alternatively, gases can also be pumped out and flown again before the deposition step or during the pause step.

It is believed that a multi-layer deposition scheme lowers effective film deposition rate, improving conformality. Also, newly deposited carbon atoms can diffuse during the pause step, improving conformality yet more. In general, conformality is improved when the number of layers increases for a given amorphous carbon film thickness (smaller individual layer thickness and more repetition) and when the ratio of pause step time to deposition step time is higher (low effective deposition rate). For example, the ratio of pause step time to deposition step time may be from about 100:1 to about 1:100. By adjusting the individual layer thickness and pause-to-deposition time ratio, the conformality of amorphous carbon film can be tailored to meet the device need, hence providing another knob to improve conformality for a given PECVD deposition condition (precursor, gas, flow rate, pressure, temperature, RF power, etc.)

Figure 2:
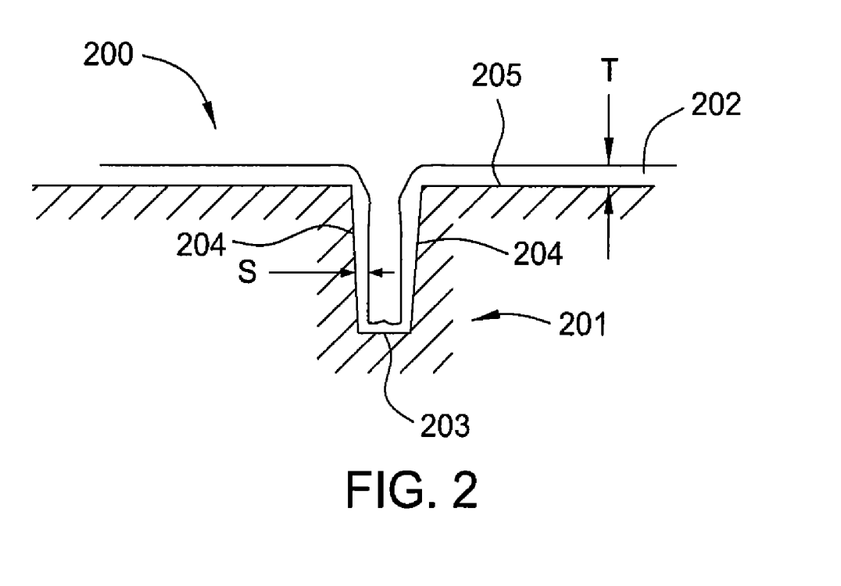
FIG. 2 is a schematic cross-sectional view of a substrate with a feature and an amorphous carbon layer formed thereon.

One major advantage of the inventive method is the enhancement of conformality over other a-C:H deposition processes, as illustrated in FIG. 2. FIG. 2 illustrates a schematic cross-sectional view of a substrate 200 with a feature 201 and an amorphous carbon layer 202 formed thereon. Amorphous carbon layer 202 illustrates the typical appearance of a film deposited using the inventive method. Qualitatively, amorphous carbon layer 202 is highly conformal and completely covers sidewalls 204 and floor 203 of feature 201. Quantitatively, amorphous carbon layer 202 may have a conformality on the order from about 30% to about 100%. For example from about 70% to about 90%, wherein conformality (measure of conformality) is defined as the ratio of the average thickness S of amorphous carbon layer 202 deposited on the sidewalls 204 to the average thickness T of amorphous carbon layer 202 on upper surface 205 of substrate 200. Referring back to FIG. 2, non-conformal amorphous carbon layer 202 is shown having a conformality of about 5%.

Examples of amorphous carbon materials deposited by the processes described herein are as follows.

Comparative example: A comparative amorphous carbon deposition process example includes providing a flow rate of helium to the processing chamber at about 400 sccm, a flow rate of Argon to the processing chamber at about 8000 sccm, providing a flow rate of $C_3H_6$ to the processing chamber at about 600 sccm, applying a high frequency RF power (13.56 MHz) at about 1250 W, maintaining a deposition temperature of about 300° C., maintaining a chamber pressure of about 4.5 Torr, with a spacing of about 380 mils to produce an amorphous carbon layer having a conformality of about 20% over dense areas and open area step coverage (measure of conformality).

In a first example, an amorphous carbon layer was deposited by providing a flow rate of helium to the processing chamber at about 4000 sccm, providing a flow rate of $C_2H_2$ to the processing chamber at about 2000 sccm, applying a high frequency RF power (13.56 MHz) at about 50 W, maintaining a deposition temperature of about 400° C., maintaining a chamber pressure of about 9 Torr, with a spacing of about 300 mils to produce a deposition rate of 187 Å/min and it was observed to achieve conformalities of about 83% dense area to about 96% open area step coverage (measure of conformality). All examples were performed on features having height to width aspects ratios of about 2.1:1.

In a second example, an amorphous carbon layer was deposited by providing a flow rate of helium to the processing chamber at about 2000 sccm, providing a flow rate of $C_2H_2$ to the processing chamber at about 2000 sccm, applying a high frequency RF power (13.56 MHz) at about 100 W, maintaining a deposition temperature of about 400° C., maintaining a chamber pressure of about 9 Torr, with a spacing of about 300 mils to produce a deposition rate of 516 Å/min and it was observed to achieve conformalities of about 82% dense area to about 86% open area step coverage (measure of conformality). The first example and the second example were performed on features having height to width aspects ratios of about 2.1:1.

In a third example, an amorphous carbon layer was deposited by providing a flow rate of helium to the processing chamber at about 4000 sccm, providing a flow rate of $C_2H_2$ to the processing chamber at about 2000 sccm, applying a high frequency RF power (13.56 MHz) at about 20 W, maintaining a deposition temperature of about 400° C., maintaining a chamber pressure of about 9 Torr, with a spacing of about 300 mils to produce a deposition rate of 64 Å/min and it was observed to achieve about 93% dense area to about 97% open area step coverage (measure of conformality).

In a fourth example, an amorphous carbon layer was deposited by providing a flow rate of helium to the processing chamber at about 4000 sccm, providing a flow rate of $C_2H_2$ to the processing chamber at about 2000 sccm, applying a high frequency RF power (13.56 MHz) at about 1000 W, maintaining a deposition temperature of about 400° C., maintaining a chamber pressure of about 7 Torr, with a spacing of about 310 mils.

In a fifth example, an amorphous carbon layer was deposited by 14 deposition cycles of a deposition step followed by helium purge step. The deposition step providing a flow rate of helium to the processing chamber at about 4000 sccm, providing a flow rate of $C_2H_2$ to the processing chamber at about 2000 sccm, applying a high frequency RF power (13.56 MHz) at about 100 W, maintaining a deposition temperature of about 300° C., maintaining a chamber pressure of about 9 Torr, with a spacing of about 300 mils to produce a deposition rate of 909 Å/min and it was observed to achieve about 84% dense area coverage (measure of conformality). The helium purge step was performed under the same process parameters with the exception of no $C_2H_2$ flow and no application of RF power.

In a sixth example, an amorphous carbon layer was deposited by 14 deposition cycles of a deposition step followed by helium purge step. The deposition step providing a (low) flow rate of helium to the processing chamber at about 400 sccm, providing a flow rate of $C_2H_2$ to the processing chamber at about 400 sccm, applying a high frequency RF power (13.56 MHz) at about 100 W, maintaining a deposition temperature of about 300° C., maintaining a chamber pressure of about 7 Torr, with a spacing of about 300 mils to produce a deposition rate of 909 Å/min and it was observed to achieve a sidewall to top conformity of 67%, a sidewall to bottom conformity of 94% and a bottom to top conformity of 72%. The helium purge step was performed under the same process parameters with the exception of no $C_2H_2$ flow and no application of RF power.

In a seventh example, a comparison of amorphous carbon layer deposited at different power ranges. For both processes, the amorphous carbon was deposited by providing a flow rate of helium to the processing chamber at about 4000 sccm, providing a flow rate of $C_2H_2$ to the processing chamber at about 2000 sccm, applying a high frequency RF power (13.56 MHz) at about 50 W or 20 W, maintaining a deposition temperature of about 400° C., maintaining a chamber pressure of about 9 Torr, with a spacing of about 300 mils. The 50 W deposition process produced a sidewall to top conformity of 82% at a deposition rate of 200 Å/min, and the 20 W deposition process produced a sidewall to top conformity of 93-97% at a deposition rate of 64 Å/min.

In an eighth example, a comparison of amorphous carbon layer deposited in cycles versus a single step deposition. For both processes, the amorphous carbon was deposited by providing a flow rate of helium to the processing chamber at about 4000 sccm, providing a flow rate of $C_2H_2$ to the processing chamber at about 2000 sccm, applying a high frequency RF power (13.56 MHz) at about 100 W, maintaining a deposition temperature of about 400° C., maintaining a chamber pressure of about 9 Torr, with a spacing of about 300 mils. The single step deposition process produced a sidewall to top conformity of 51%, a sidewall to bottom conformity of 87% and a bottom to top conformity of 59%. The cyclical deposition step included 14 cycles of deposition followed by a helium purge step produced a sidewall to top conformity of 71%, a sidewall to bottom conformity of 92% and a bottom to top conformity of 77%. The helium purge step was performed under the same conditions with no RF power being applied and no $C_2H_2$ being provided.

In a ninth example, a comparison of amorphous carbon layer deposited in two cyclic process versus a single step deposition. For both processes, the amorphous carbon was deposited by providing a flow rate of helium to the processing chamber at about 4000 sccm, providing a flow rate of $C_2H_2$ to the processing chamber at about 2000 sccm, applying a high frequency RF power (13.56 MHz) at about 50 W, maintaining a deposition temperature of about 400° C., maintaining a chamber pressure of about 9 Torr, with a spacing of about 300 mils. The single step deposition process used a 25 W RF power application and produced a sidewall to top conformity of 56% for dense structures and a sidewall to top conformity of 87% for open structures. The first series of cyclic processes of the first cyclic process used 25 deposition and helium cool cycle described above at 20 Å each over 7 seconds a sidewall to top conformity of 55% for dense structures and a sidewall to top conformity of 82% for open structures; and the second series used 10 deposition and helium cycles at 50 Å each over 15 seconds a sidewall to top conformity of 54% for dense structures and a sidewall to top conformity of 75% for open structures. The first series of cyclic processes of the second process used 25 seven second deposition cycles at 20 Å each a sidewall to top conformity of 78% for dense structures and a sidewall to top conformity of 89% for open structures; the second series used 10 fifteen second deposition cycles at 50 Å each a sidewall to top conformity of 69% for dense structures and a sidewall to top conformity of 89% for open structures; and the third series used 25 seven second deposition and 13 second stabilization step cycles at 20 Å each a sidewall to top conformity of 55% for dense structures and a sidewall to top conformity of 92% for open structures.

Figure 4A:
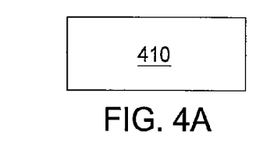
FIGS. 4A-4L are schematic side views of one embodiment of a process for using an amorphous carbon layer as described herein to etch a material layer.
Figure 4B:
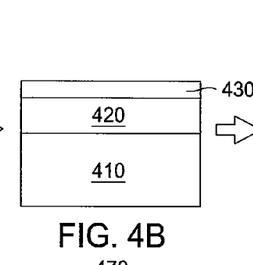

FIGS. 4A-4I are schematic side views of a process for using an amorphous carbon layer as described herein to etch a material layer. A base material 410 is deposited on a substrate surface (not shown) to begin forming a material stack 400. The base material may be one or more materials used in forming semiconductor devices including a silicon substrate material, an oxide material, a polysilicon material, or the like. A first amorphous carbon layer 420 is deposited on the base material 410 and a first anti-reflective coating material 430 is deposited on the first amorphous carbon layer 420 as shown in FIG. 4B. The amorphous carbon layer may be an Advanced Patterning Film™ (APF) material commercially available from Applied Materials, Inc. of Santa Clara, Calif., or alternatively, an amorphous carbon material as described herein.

The first anti-reflective coating material 430 is used to control the reflection of light during a lithographic patterning process. The first anti-reflective coating material 430 may comprise silicon dioxide, silicon oxynitride, silicon nitride, or combinations thereof. The anti-reflective coating material may be a DARC™ material layer commercially available from Applied Materials, Inc. of Santa Clara, Calif.

Figure 4C:
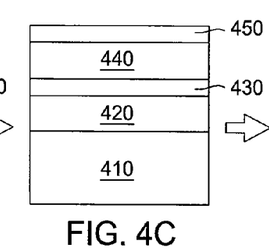
Figure 4D:
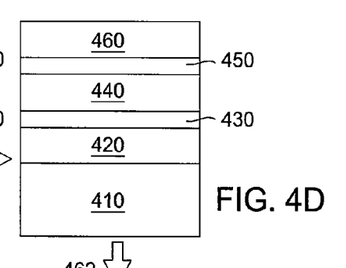
Figure 4E:
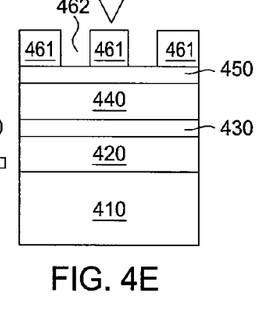
Figure 4F:
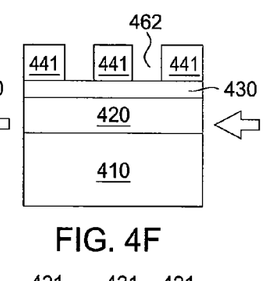

A second amorphous carbon layer 440 and a second antireflective coating material 450 may be deposited sequentially on the first antireflective coating material as shown in FIG. 4C. The second amorphous carbon layer 440 and second antireflective coating material 450 may be the same materials as deposited for layer 420 and first anti-reflective coating material 430. A resist layer 460, such as a photoresist material, is then deposited on the second antireflective coating material 450 as shown in FIG. 4D. The resist layer is then patterned by a lithographic process producing a patterned resist layer 461 as shown in FIG. 4E. The first pattern 462 formed in the resist layer 461 is transferred to the second amorphous carbon layer 440 to form a patterned second amorphous carbon layer 441 by first etching the second antireflective coating material 450 and then the second amorphous carbon layer 440 by one or more etching processes as shown in FIG. 4F. The patterned second amorphous carbon layer 441 may perform as a hardmask for the underlying material. The second antireflective coating material 450 may be removed by the one or more etching processes or by a separate process.

Figure 4G:
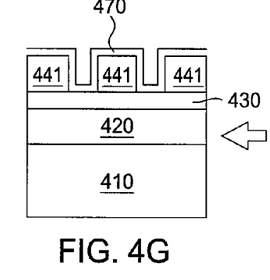
Figure 4H:
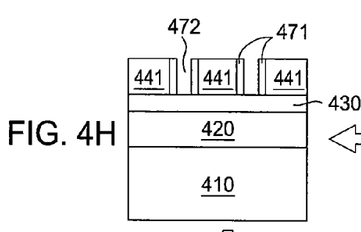

A conformal amorphous carbon layer 470 is deposited on the first antireflective coating material 430 and the patterned second amorphous carbon layer 441 as shown in FIG. 4G. The conformal amorphous carbon layer may be deposited by any of the processes described herein. The conformal amorphous carbon layer 470 is patterned by an anisotropic etch process to provide for sidewall amorphous carbon materials 471 as shown in FIG. 4H. The presence of the sidewall amorphous carbon materials 471 allows for the formation of a second pattern 472 with reduced critical dimensions and feature sizes, i.e., increased pattern density, than can otherwise normally be achieved through current photolithographic processes. The patterned second amorphous carbon layer 441 in combination with the sidewall amorphous carbon materials 471 may perform as a hardmask layer for the underlying first anti-reflective coating material 430 and the first amorphous carbon layer 420.

Figure 4I:
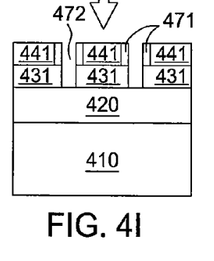
Figure 4J:
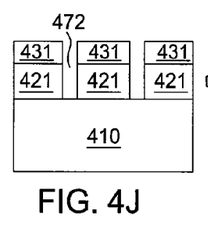
Figure 4K:
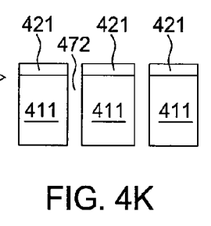
Figure 4L:
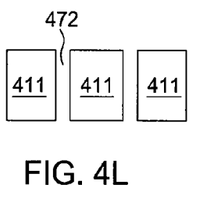

The first antireflective coating material 430 is then etched to form a patterned antireflective coating layer 431 with the second pattern 472 as shown in FIG. 4I. The patterned second amorphous carbon layer 441 and the sidewall amorphous carbon materials 471 are removed during the etching process or by a subsequent process. The first amorphous carbon layer 420 is then etched to form a patterned first amorphous carbon layer 421 having the second pattern 472 to be transferred to the underlying base material 410. The base material 410 is then etched using the patterned first amorphous carbon layer 421 as a hardmask layer as shown in FIG. 4K and the patterned first amorphous carbon layer 421 is removed to provide a substrate surface with a patterned base material 411 having the second pattern 472 as shown in FIG. 4L.

In an alternative embodiment, a patterned resist material is used in place of the patterned second amorphous carbon layer 441 for FIGS. 4F-4L, thereby eliminating the need for the patterned second amorphous carbon layer 440 and a second antireflective coating material 450 and the corresponding deposition steps and etching steps of FIGS. 4C-4E.

Figure 5A:
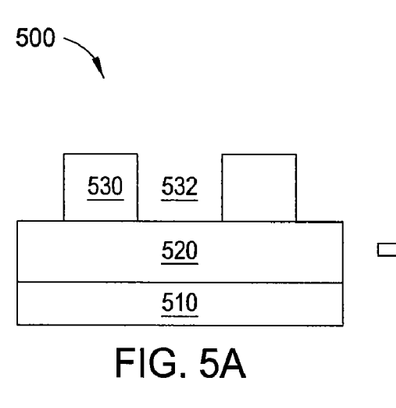
FIGS. 5A-5H and 5E' are schematic side views of one embodiment of a process for using an amorphous carbon layer as described herein in a space mask double patterning process.
Figure 5B:
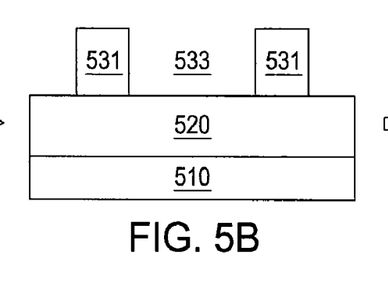
Figure 5C:
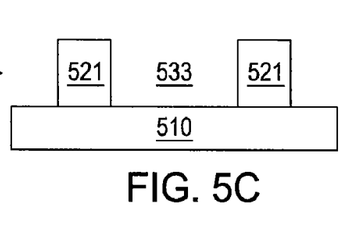

FIGS. 5A-5H are schematic side views of a process for using an amorphous carbon layer as described herein in a space mask double patterning process. A base material 510 is deposited on a substrate surface to begin forming a material stack 500. The base material may be one or more materials used in forming semiconductor devices including a silicon substrate material, an oxide material, a polysilicon material, or the like. A first amorphous carbon layer 520 is deposited on the base material 510 and a patterned resist layer 530 having a first pattern 532 is formed on the first amorphous carbon layer 520 as shown in FIG. 5A. The amorphous carbon layer may be an Advanced Patterning Film™ (APF) material commercially available from Applied Materials, Inc. of Santa Clara, Calif., or alternatively, an amorphous carbon material as described herein. The resist layer 530 may be patterned by a lithographic process. The patterned resist layer 530 is then subjected to a trimming process, thereby, narrowing the width of the patterned resist materials to form a second pattern 533 defined by the trimmed resist material 531 as shown in FIG. 5B. The first amorphous carbon layer 520 is then etched to transfer the second pattern 533 to form a patterned amorphous carbon layer 521 as shown in FIG. 5C.

Sidewall spacers 540 are then formed adjacent the patterned amorphous carbon layer 521 structures. Spacers may comprise an etchable material having an etching rate different from the first amorphous carbon layer or conformal amorphous carbon material. Suitable materials include, for example, silicon dioxide, silicon oxynitride, silicon nitride, or combinations thereof. A gap fill layer 550 of conformal amorphous carbon material is then deposited on the sidewall spacers 540 and patterned amorphous carbon layer 521 structures as shown in FIG. 5E. The conformal amorphous carbon material may be deposited by any of the processes described herein. Preferred conformal amorphous carbon material are those materials having similar etch characteristics as patterned amorphous carbon layer 521. The gap fill layer 550 is then etched back to expose the sidewall spacers 540 as shown in FIG. 5F. The sidewall spacers 540 are then etched to expose the base material 510 defining a hardmask layer 551 as shown in FIG. 5G. The base material 510 may then be patterned etched to form a patterned base material 511 as shown in FIG. 5H.

Figure 5D:
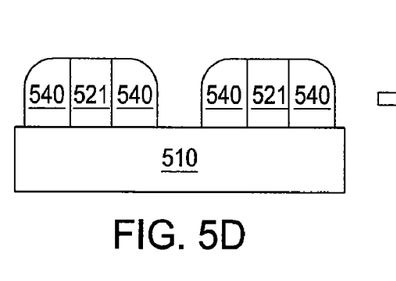
Figure 5E:
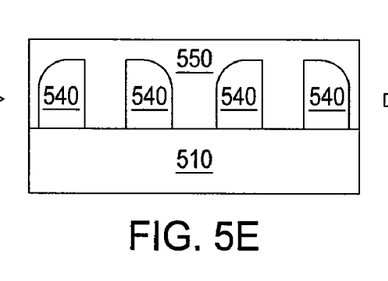
Figure 5F:
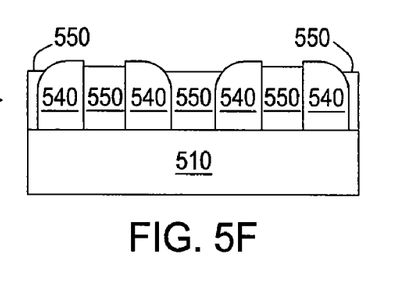
Figure 5G:
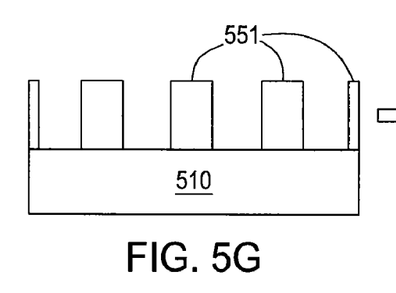
Figure 5H:
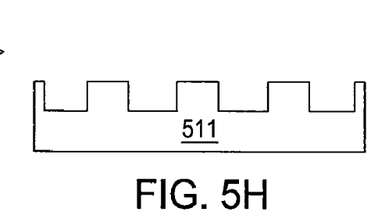

In an alternative process, after the sidewall spacers 540 are formed adjacent the patterned amorphous carbon layer 521 structures as shown in FIG. 5D, the patterned amorphous carbon layer 521 is then stripped from the substrate surface. The sidewall spacers 540 then form a pattern as shown in FIG. 5E', which may be used as a hardmask for the base material 510. The base material 510 may then be patterned etched to form a patterned base material 511.

Figure 6A:
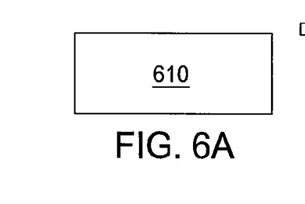
FIGS. 6A-6J are schematic side views of another embodiment of a process for using an amorphous carbon layer as described herein to etch a material layer.
Figures 6B, 6C, 6D, 6E, 6F, 6G:
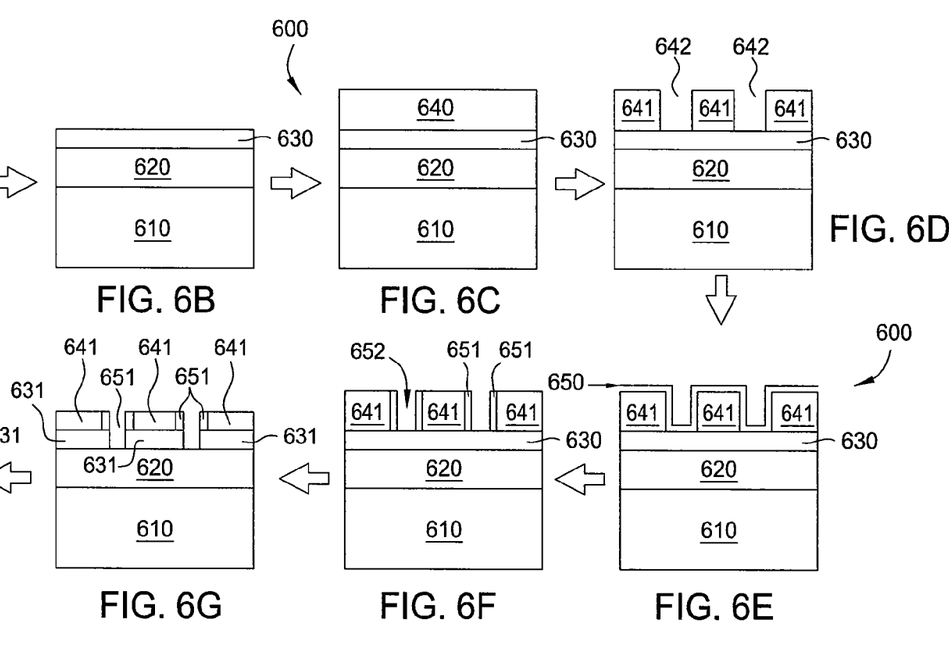

FIGS. 6A-6J are schematic side views of a process for using an amorphous carbon layer as described herein to etch a material layer, for example, by a amorphous carbon deposition process at less than 100° C. A base material 610 is deposited on a substrate surface (not shown) to begin forming a material stack 600. The base material may be one or more materials used in forming semiconductor devices including a silicon substrate material, an oxide material, a polysilicon material, or the like. A first amorphous carbon layer 620 is deposited on the base material 610 and an anti-reflective coating material 630 is deposited on the first amorphous carbon layer 620 as shown in FIG. 6B. The amorphous carbon layer may be an Advanced Patterning Film™ (APF) material commercially available from Applied Materials, Inc. of Santa Clara, Calif., or alternatively, an amorphous carbon material as described herein. The anti-reflective coating material 630 is used to control the reflection of light during a lithographic patterning process. The anti-reflective coating material 630 may comprise silicon dioxide, silicon oxynitride, silicon nitride, or combinations thereof. The anti-reflective coating material may be a DARC™ material layer commercially available from Applied Materials, Inc. of Santa Clara, Calif.

A resist layer 640, such as a photoresist material, is then deposited on the antireflective coating material 630 as shown in FIG. 6C. The resist layer is then patterned by a lithographic process producing a patterned resist layer 641 as shown in FIG. 6D. The patterned resist layer 641 forms a first etch pattern 642.

A second amorphous carbon layer 650 is deposited conformally or substantially conformally on the patterned resist layer 641 by the processes and conformalities described herein as shown in FIG. 6E. The conformal amorphous carbon layer may be deposited by any of the processes described herein. In one example, the second amorphous carbon material is deposited by a deposition process of less than 100° C. The second amorphous carbon layer 650 is etched and patterned to form a second etch pattern 652 having reduced, e.g., narrower, feature dimensions that the first etch pattern as Shown on FIG. 6F. The conformal second amorphous carbon layer 650 is patterned by an anisotropic etch process to provide for sidewall amorphous carbon materials 651.

The presence of the sidewall amorphous carbon materials 651 allows for the formation of a second etch pattern 652 with reduced critical dimensions and feature sizes, i.e., increased pattern density, than can otherwise normally be achieved through current photolithographic processes. By such a process, the dimensions, such as the critical dimensions, of the features definitions formed in the resist layer can be reduced ("shrinked") to provide for a finer feature pattern in the underlying layers. The patterned resist layer 641 in combination with the sidewall amorphous carbon materials 651 may perform as a hardmask layer for the underlying antireflective coating material 630 and the first amorphous carbon layer 620.

Figure 6H:
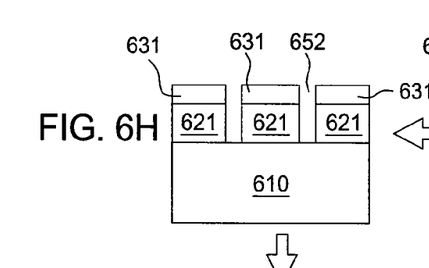

The second etch pattern 652 formed with the sidewall amorphous carbon materials 651 and the resist layer 641 is transferred to the first amorphous carbon layer 620 to form a patterned first amorphous carbon layer 621 by first etching the antireflective coating material 630 as shown in FIG. 6G and then the first amorphous carbon layer 620 by one or more etching processes as shown in FIG. 6H. The patterned first amorphous carbon layer 621 may perform as a hardmask for the underlying base material 610. The antireflective coating material 631 may be removed by the one or more etching processes or by a separate process prior to etching the underlying material.

Figure 6I:
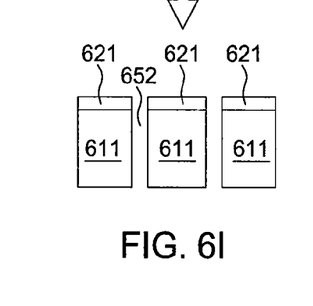
Figure 6J:
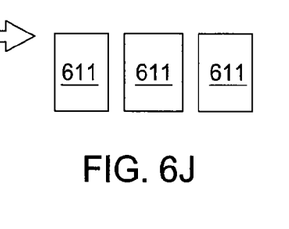

The first amorphous carbon layer 620 is then etched to form a patterned first amorphous carbon layer 621 having the second etch pattern 652 to be transferred to the underlying base material 610 as shown in FIG. 6H. The base material 610 is then etched using the patterned first amorphous carbon layer 621 as a hardmask layer as shown in FIG. 6I and the patterned first amorphous carbon layer 621 is removed to provide a substrate surface with a patterned base material 611 having the second etch pattern 652 as shown in FIG. 6J.

Figure 7:
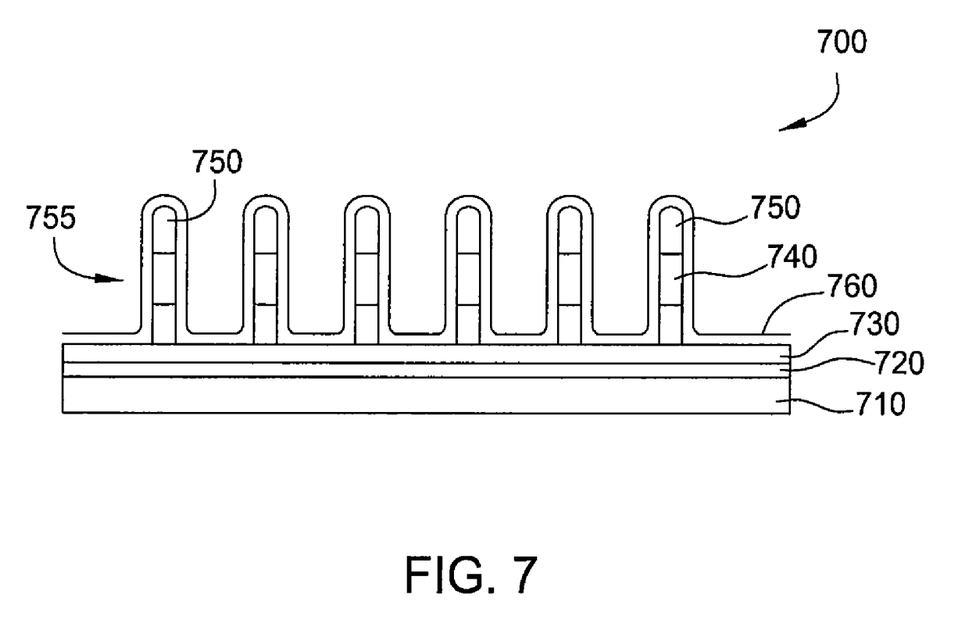
FIG. 7 is a schematic side view of the use of an amorphous carbon layer disposed herein in a semiconductor structure.

FIG. 7 is a schematic side view of the use of an amorphous carbon layer disposed herein in a semiconductor structure. FIG. 7 discloses the use of an amorphous carbon layer deposited by one of the processes described herein for use as a sacrificial sidewall mask for an inversed-T gate 700. A tunnel oxide layer 720 is deposited on the substrate 710. A doped polysilicon layer 730 is deposited on the tunnel oxide layer, and a high thermal oxide (HTO) layer 740 is deposited on the doped polysilicon layer 730. A mask layer 750 is deposited on the high thermal oxide (HTO) 740. The mask layer 750 is patterned and the oxide layer 740 doped polysilicon layer 730 are etched to form features 755. An amorphous carbon layer 760 deposited by one of the methods described herein is deposited over the etch substrate surface to form sidewall coverage of the formed features 755.

While the foregoing is directed to embodiments of the present invention, other and further embodiments of the invention may be devised without departing from the basic scope thereof, and the scope thereof is determined by the claims that follow.

What is claimed is:

1. A method of forming an amorphous carbon layer on a substrate, comprising:
 positioning a substrate in a substrate processing chamber;
 performing a deposition cycle, comprising:
  introducing a hydrocarbon source having a carbon to hydrogen atom ratio greater than 1:2 into the processing chamber;
  introducing a plasma initiating gas selected from the group consisting of hydrogen, helium, argon, nitrogen, and combinations thereof into the processing chamber, with the hydrocarbon source having a volumetric flow rate to plasma initiating gas volumetric flow rate ratio of 1:2 or greater;
  generating a plasma in the processing chamber at a RF power density of 1 W/cm$^2$ or less, a pressure of 2 Torr or greater, and a temperature of about 300° C. to about 480° C.;
  forming a conformal amorphous carbon layer on the substrate; and
  performing a purge processing step after forming the conformal amorphous carbon layer by flowing a purge gas through the processing chamber, wherein the purge processing step comprises a pause step time and forming the conformal amorphous carbon layer comprises a deposition step time, wherein the ratio of the pause step time to the deposition step time is from about 100:1 to about 1:100; and
 repeating the deposition cycle from 2 to 50 times.

2. The method of claim 1, wherein the deposition cycle further comprises introducing a dilutant gas into the processing chamber with the hydrogen precursor, the plasma-initiating gas, or both.

3. The method of claim 1, wherein the hydrocarbon source has a carbon to hydrogen atom ratio of 2:3 or greater and comprises one or more compounds selected from the group of acetylene, vinylacetylene, benzene, styrene, toluene, xylene, pyridine, acetophenone, phenol, furan, $C_3H_2$, $C_5H_4$, monofluorobenzene, difluorobenzenes, tetrafluorobenzenes, and hexafluorobenzene.

4. The method of claim 1, wherein the hydrocarbon gas volumetric flow rate to plasma initiating gas volumetric flow rate ratio is from about 1:1 to about 1:2.

5. The method of claim 1, wherein the RF power density is applied from about 0.01 to about 1 W/cm$^2$.

6. The method of claim 1, wherein the pressure is from about 2 Torr to about 20 Torr.

7. The method of claim 1, wherein the RF power is provided by a dual-frequency system.

8. The method of claim 1, wherein the conformal amorphous carbon layer has a conformality from about 30% to about 100%.

9. The method of claim 1, wherein the purge gas comprises an inert gas or a hydrocarbon source gas.

10. A method of forming an amorphous carbon layer on a substrate, comprising:
 positioning a substrate in a substrate processing chamber;
 performing a deposition cycle, comprising:

introducing a hydrocarbon source having a carbon to hydrogen atom ratio greater than 1:2 into the processing chamber;

introducing a plasma initiating gas selected from the group consisting of hydrogen, helium, argon, nitrogen, and combinations thereof into the processing chamber, with the hydrocarbon source having a volumetric flow rate to plasma initiating gas volumetric flow rate ratio of 1:2 or greater;

generating a plasma in the processing chamber at a RF power density of 1 W/cm² or less, a pressure of 2 Torr or greater, and a temperature of about 300° C. to about 480° C.;

forming a conformal amorphous carbon layer on the substrate; and performing a purge processing step after forming the conformal amorphous carbon layer by flowing a purge gas through the processing chamber, wherein the purge gas is excited into a plasma; and repeating the deposition cycle from 2 to 50 times.

11. The method of claim 1, wherein each deposition cycle deposits between 2% and 50% of the thickness of the conformal amorphous carbon layer.

12. A method of forming an amorphous carbon layer on a substrate, comprising:

positioning a substrate in a substrate processing chamber;

introducing a hydrocarbon source having a carbon to hydrogen atom ratio of greater than 1:2 into the processing chamber;

introducing a plasma initiating gas consisting of helium into the processing chamber, with the hydrocarbon source having a volumetric flow rate to plasma initiating gas volumetric flow rate ratio of 1:2 or greater, wherein the hydrocarbon source and the plasma initiating gas are introduced into the processing chamber by a gas distributor position between 400 mils and 600 from the substrate surface;

generating a plasma in the processing chamber at a RF power of 1 W/cm² or less a pressure of 9 Torr, and a temperature of 75° C.; and forming a conformal amorphous carbon layer on the substrate.

13. The method of claim 12, wherein the conformal amorphous carbon layer has a conformality of about 72%.

14. The method of claim 13, wherein the conformal amorphous carbon layer is formed over about 9 feature definitions per 1600 nm² of substrate surface.

15. The method of claim 12, wherein the gas distributor position is at 500 mils from the substrate surface.

16. The method of claim 15, wherein the conformal amorphous carbon layer has a conformality of 90% or greater.

17. The method of claim 16, wherein the conformal amorphous carbon layer is formed over between 4 to 20 feature definitions per 1600 nm² of substrate surface.

* * * * *

UNITED STATES PATENT AND TRADEMARK OFFICE
CERTIFICATE OF CORRECTION

PATENT NO. : 8,105,465 B2  
APPLICATION NO. : 12/577455  
DATED : January 31, 2012  
INVENTOR(S) : Lee et al.

Page 1 of 1

It is certified that error appears in the above-identified patent and that said Letters Patent is hereby corrected as shown below:

In the Claims:

Column 17, Claim 12, Line 27, please delete "of";

Column 18, Claim 12, Line 7, insert --mils-- after 600.

Signed and Sealed this
Fifteenth Day of May, 2012

David J. Kappos
*Director of the United States Patent and Trademark Office*